(12) United States Patent
Chen et al.

(10) Patent No.: US 9,999,162 B2
(45) Date of Patent: Jun. 12, 2018

(54) COOLING SYSTEM AND CIRCUIT LAYOUT WITH MULTIPLE NODES

(71) Applicant: SUPER MICRO COMPUTER, INC., San Jose, CA (US)

(72) Inventors: Richard S. Chen, San Jose, CA (US); Andy Chen, San Jose, CA (US); Jonathan M. Lee, Fremont, CA (US); Wenjuan Yu, San Jose, CA (US)

(73) Assignee: SUPER MICRO COMPUTER, INC., San Jose, CA (US)

( * ) Notice: Subject to any disclaimer, the term of this patent is extended or adjusted under 35 U.S.C. 154(b) by 0 days. days.

(21) Appl. No.: 14/597,046

(22) Filed: Jan. 14, 2015

(65) Prior Publication Data

US 2016/0029519 A1   Jan. 28, 2016

Related U.S. Application Data

(60) Provisional application No. 62/029,947, filed on Jul. 28, 2014.

(51) Int. Cl.
   *H05K 7/20*       (2006.01)
(52) U.S. Cl.
   CPC ..... *H05K 7/20727* (2013.01); *H05K 7/20172* (2013.01)
(58) Field of Classification Search
   CPC ........... H05K 7/20727; H05K 7/20736; H05K 7/20172
   USPC ........................................... 361/679.48, 695
   See application file for complete search history.

(56) References Cited

U.S. PATENT DOCUMENTS

| | | | | |
|---|---|---|---|---|
| 5,615,999 A | * | 4/1997 | Sukup ................... | F04D 29/545 415/182.1 |
| 5,803,709 A | * | 9/1998 | Matthews ............. | F04D 29/545 415/182.1 |
| 6,254,343 B1 | * | 7/2001 | Schmidt ................ | F04D 29/545 415/222 |
| 6,894,897 B1 | * | 5/2005 | Nagurny ............ | H05K 7/20172 165/122 |
| 7,577,767 B1 | * | 8/2009 | Robillard ................ | G06F 1/206 324/161 |
| 2006/0138247 A1 | * | 6/2006 | Shen ....................... | G06F 1/203 236/49.3 |
| 2006/0237169 A1 | * | 10/2006 | Franz ..................... | F28D 15/02 165/104.33 |
| 2010/0008038 A1 | * | 1/2010 | Coglitore .................. | G06F 1/20 361/679.48 |

* cited by examiner

*Primary Examiner* — Mukund G Patel
(74) *Attorney, Agent, or Firm* — Artegis Law Group, LLP

(57) ABSTRACT

A circuit layout includes two or more high performance processing nodes that are cooled by a cooling fan. The cooling fan resides in a cooling fan assembly that relies on principles of aerodynamics to maximize airflow. The cooling fan assembly is coupled to the opposite side of a backplane to which the circuit layout is mounted. The backplane includes large ventilation holes to permit the cooling fan to induce significantly more airflow across the circuit layout than possible with conventional designs. At least one advantage of the approaches discussed herein is circuit layouts can be constructed to meet the competing objectives of high node performance and high node density. Accordingly, data centers can be built that offer high performance computing without requiring a significant increase in physical real estate.

19 Claims, 9 Drawing Sheets

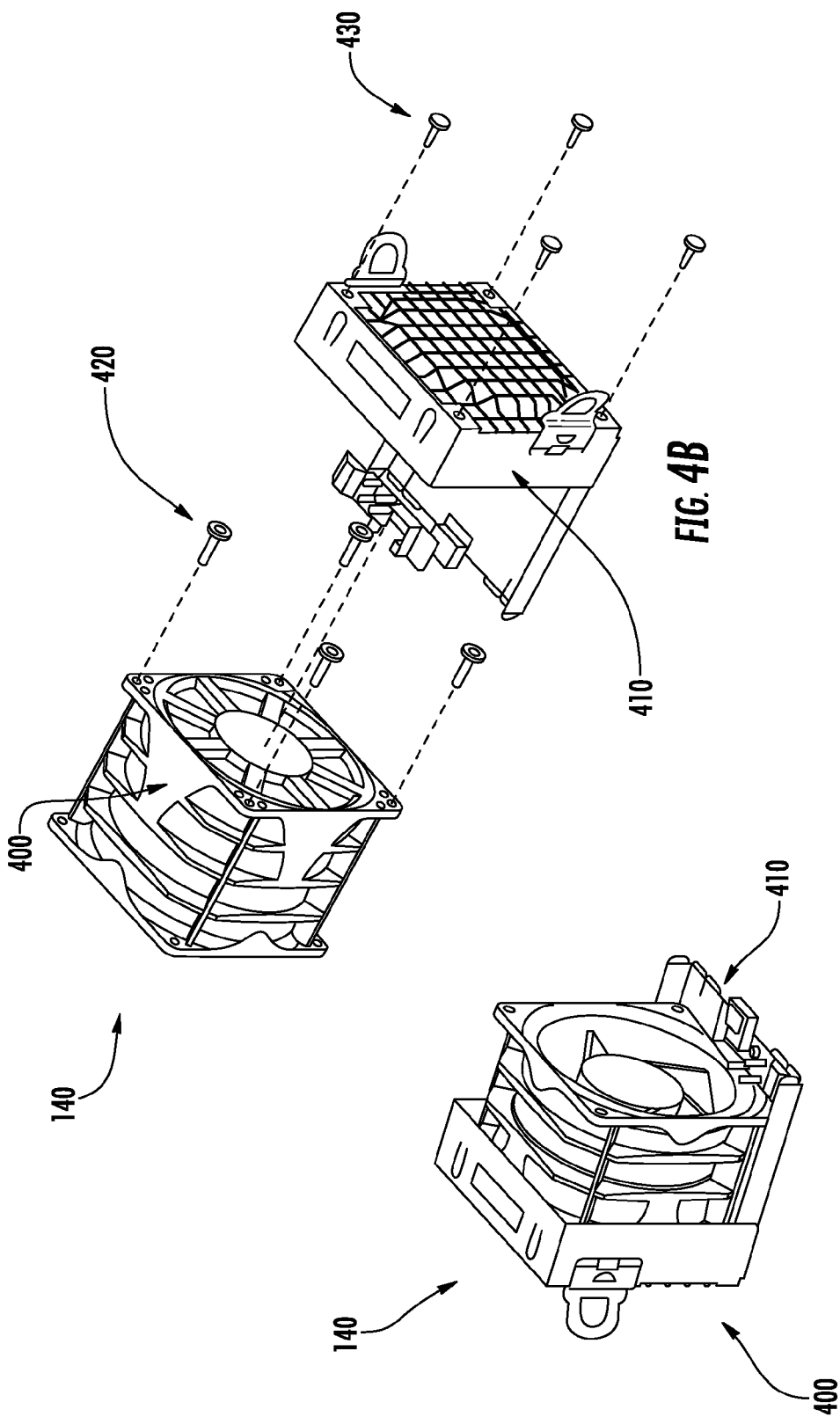

COOLING SYSTEM AND CIRCUIT LAYOUT WITH MULTIPLE NODES

CROSS-REFERENCE TO RELATED APPLICATIONS

This application claims the benefit of United States provisional patent application titled, "Cooling System and Integrated Circuit with Multiple Nodes," filed on Jul. 28, 2014 and having Ser. No. 62/029,947. The subject matter of this related application is hereby incorporated herein by reference.

BACKGROUND OF THE INVENTION

Field of the Invention

The present invention relates generally to server systems, and, more specifically, to a cooling system and circuit layout with multiple nodes.

Description of the Related Art

A server machine, or server, is a type of computing device configured to provide various services to client machines, or clients, that connect to the server via a network. For example, a conventional web server could provide access to a website by transmitting files associated with the website to clients that connect to the server via the Internet. Conventional servers generally execute one or more server applications in order to provide access to the various services mentioned above. Returning to the previous example, a web server typically executes a web server application that manages the transmission of the aforementioned files.

A server is often implemented as a single processing node that is disposed on a printed circuit board (PCB). The single processing node typically executes the server software mentioned above. The PCB includes various components that support the operation of the processing node, including a basic input output system (BIOS), memory, and other related hardware. Multiple PCBs, each of which includes a single processing node, can be mounted within a server chassis. Multiple server chassis can then be coupled within a server rack. Multiple server racks can be combined within a building to form a datacenter. Datacenters form the backbone of many different data-intensive applications, including online gaming applications, social networking websites, cloud-based photo storage utilities, and so forth.

The construction and configuration of a datacenter is typically driven by at least two design objectives. First, a datacenter should provide access to high performance processors in order to meet the needs of any data-intensive applications configured to execute within the datacenter. For example, if a datacenter is intended to provide access to an online video game that involves the rendering of complex graphics, then the datacenter should include servers capable of delivering high performance, graphics rendering capabilities. Second, a datacenter should efficiently use the physical space within the datacenter by maximizing the density of servers within the physical space. Since datacenters require physical real estate, and physical real estate is generally expensive, a cost-effective approach to building a datacenter would involve packing servers into the datacenter as densely as possible.

One problem with the construction of conventional datacenters is that the two design objectives discussed above are typically at odds with one another. Specifically, providing high performance processing capabilities generally requires larger and more complex PCBs with bulky cooling systems and additional electronics, which decreases server density by reducing the number of server machines that can fit into a given physical space. Consequently, with conventional approaches, datacenters cannot easily be constructed to provide both high performance and high server density.

As the foregoing illustrates, what is needed in the art is a more effective way to increase both server computing power and server density.

SUMMARY OF THE INVENTION

One embodiment of the present invention sets forth a system, including a circuit layout that includes at least a first processing node and a second processing node, a backplane coupled to the circuit layout and including a plurality of ventilation holes, and a fan assembly coupled to the backplane and configured to deliver an airflow across the circuit layout, where the fan assembly includes a fan having a convergent-divergent cross sectional area and including a first rotor disposed substantially midway along an axis of the fan.

At least one advantage of the present invention is that circuit layouts can be constructed to meet the competing objectives of high node performance and high node density. Accordingly, data centers can be built that offer high performance computing without requiring a significant increase in physical real estate.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A-4B are more detailed illustrations of the fan assembly of FIG. 1B, according to one embodiment of the present invention;

DETAILED DESCRIPTION OF EXEMPLARY EMBODIMENTS

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1A:
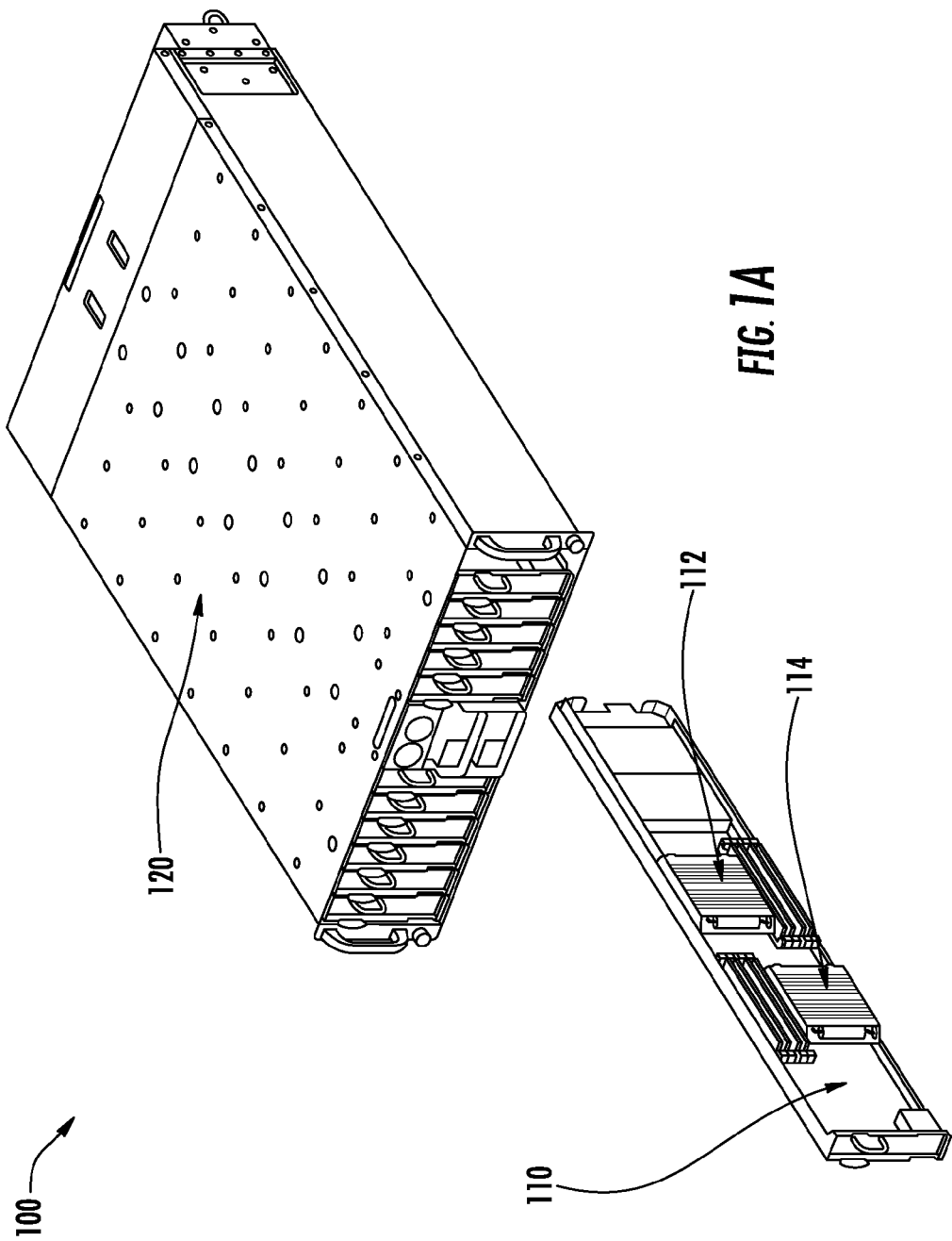
FIGS. 1A-1B illustrate a system configured to implement one or more aspects of the present invention.
Figure 1B:
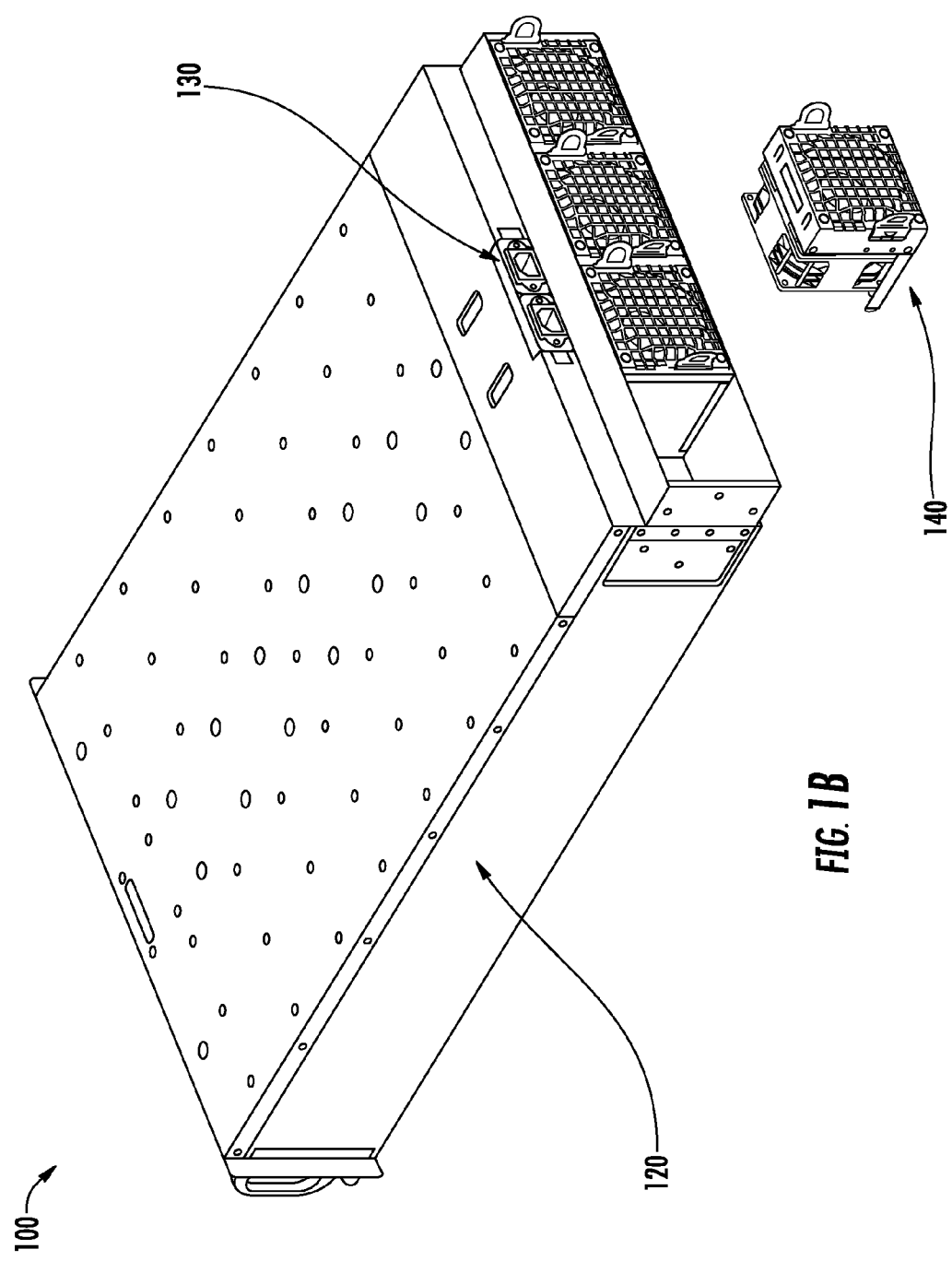

FIGS. 1A-1B illustrate a system configured to implement one or more aspects of the present invention. As shown in FIG. 1A, system 100 includes an integrated circuit 110 configured for insertion into a chassis 120. Circuit layout 110 includes processing nodes 112 and 114. As shown in FIG. 1B, chassis 120 is coupled to a backplane 130 that, in turn, is coupled to a fan assembly 140.

Referring generally to FIGS. 1A-1B, the various components shown in these Figures are described in greater detail below in conjunction with FIGS. 2-5. Specifically, Circuit layout 110 is described in greater detail below in conjunction with FIG. 2, backplane 130 is described in greater detail below in conjunction with FIGS. 3A-3C, and fan assembly 140 is described in greater detail below in conjunction with FIGS. 4A-5. In addition, hardware for mounting fan assembly 140 to backplane 130 is discussed in greater detail below in conjunction with FIGS. 6A-6B, and a technique for cooling circuit layout 110 is described in greater detail below in conjunction with FIG. 7.

Circuit layout 110 may be inserted into chassis 120 in the fashion shown in FIG. 1A along with other instances of circuit layout 110. Chassis 120 may be configured to include multiple instances of circuit layout 110 to form a server rack. Multiple instances of chassis 120, each configured to include multiple instances of circuit layout 110, may be housed together to form a datacenter. A datacenter or server rack that includes instances of circuit layout 110 may have a higher node density than possible with conventional circuit layouts, for reasons discussed below.

As is known in the art, "node density" generally refers to the number of processing nodes capable of occupying a given volume of space. Since circuit layout 110 includes two processing nodes (112 and 114), circuit layout 110 has a higher node density compared to previous designs that only include one processing node. Thus, server racks and datacenters configured to include circuit layout 110 may provide access to twice the compute power of previous single-node designs.

In conventional single-node designs, limited cooling ability precludes more than one processing node from operating on a single circuit layout since additional processing nodes generate excessive heat and increase the operating temperature of those nodes beyond design limitations. However, with the various techniques described herein, sufficient cooling can be achieved to allow multiple high-performance processing nodes to reside on a single circuit layout without violating design considerations and overheating.

Specifically, backplane 130 includes oversized ventilation holes to allow a significantly increased level of airflow across circuit layout 110 when fan assembly 140 is coupled thereto, thereby facilitating more efficient cooling. In addition, fan assembly 140 includes a specialized fan that relies on the Venturi effect to maximize airflow through the oversized ventilation holes of backplane 130. Fan assembly is constructed using specialized fasteners that reduce vibration and improve the efficiency of that fan assembly. These various improvements, in combination with one another, provide superior cooling to circuit layout 110 compared to prior approaches.

Figure 2:
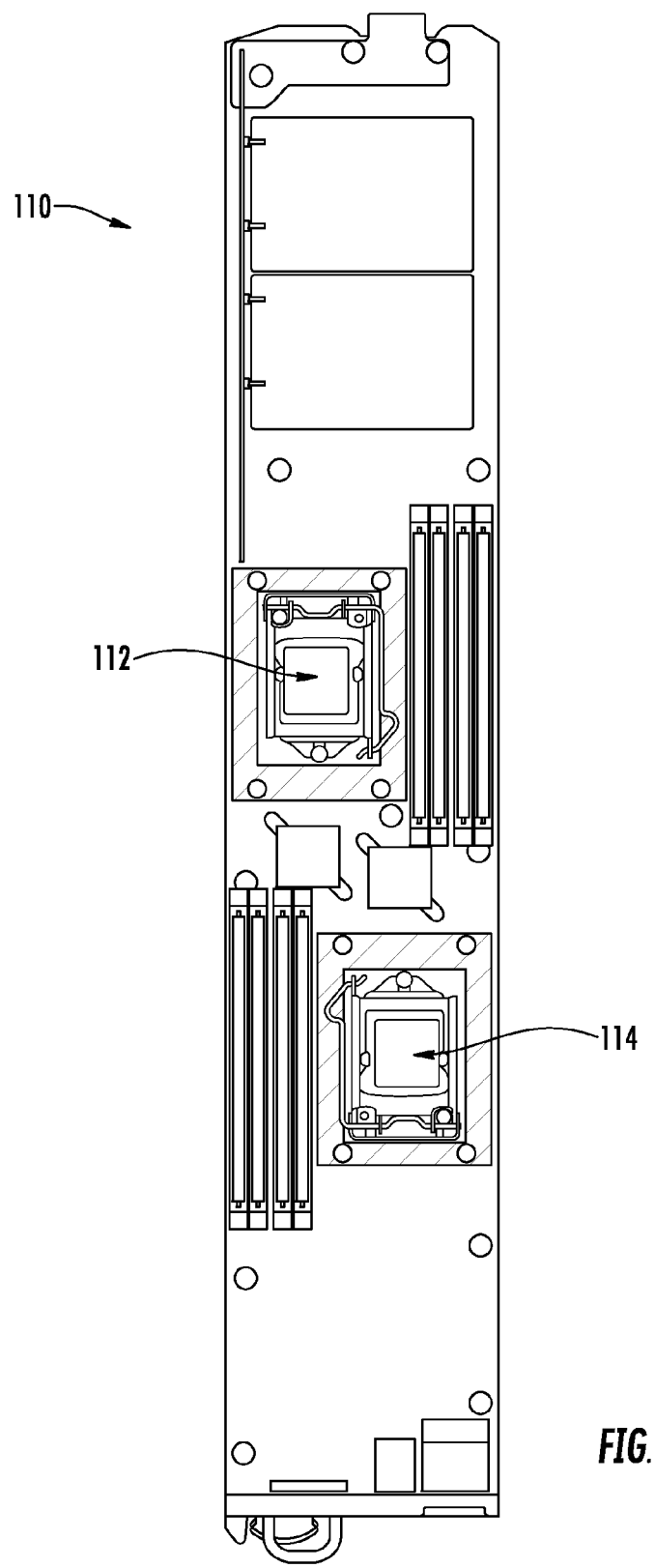
FIG. 2 is a more detailed illustration of the integrated circuit of FIG. 1A, according to one embodiment of the present invention.

FIG. 2 is a more detailed illustration of the integrated circuit of FIG. 1A, according to one embodiment of the present invention. As shown, circuit layout 110 includes processing nodes 112 and 114. Circuit layout 110 may be a printed circuit board (PCB), integrated circuit, motherboard, or any other technically feasible type of circuitry configured to support the operation of processing nodes 112 and 114. Each of processing nodes 112 and 114 may be a central processing unit (CPU), a graphics processing units (GPU), a CPU coupled to a GPU, or any other technically feasible type of processing unit. In one embodiment, processing units 112 and 114 are Intel® Xeon® processors.

Circuit layout 110 may provide various resources to processing units 112 and 114 that allow those processing units to operate, including a power supply, BIOS, memory, thermal management systems, and so forth. Processing units 112 and 114 are configured within circuit layout 110 to share some or all of the resources provided by circuit layout. In one embodiment, processing units 112 and 114 are coupled to a single power supply (not shown) associated with circuit layout 110.

Processing nodes 112 and 114 are configured to operate as server machines that perform various operations on behalf of client computing devices coupled thereto via a network, such as the Internet. Each of processing nodes 112 and 114 may execute a server application to facilitate these operations. In one embodiment, processing nodes 112 and 114 execute web server applications that configure those processing nodes to perform various web services, including the transmittal of web-related content such as hyper-text markup language (HTML) files, client-side code, media files, and so forth.

As mentioned above, conventional circuit layouts typically cannot include more than one processing node without causing overheating and possible hardware failure due to thermal effects. These issues are exacerbated when high-performance processing nodes are needed, since higher performance nodes generally produce more heat than lower performance nodes. System 100 circumvents these thermal issues via backplane 130 and fan assembly 140, which are configured to operate in conjunction with one another to provide a greater level of cooling than possible with previous designs. These two elements are described in conjunction with FIGS. 3A-3B and 4A-6, respectively.

Figure 3A:
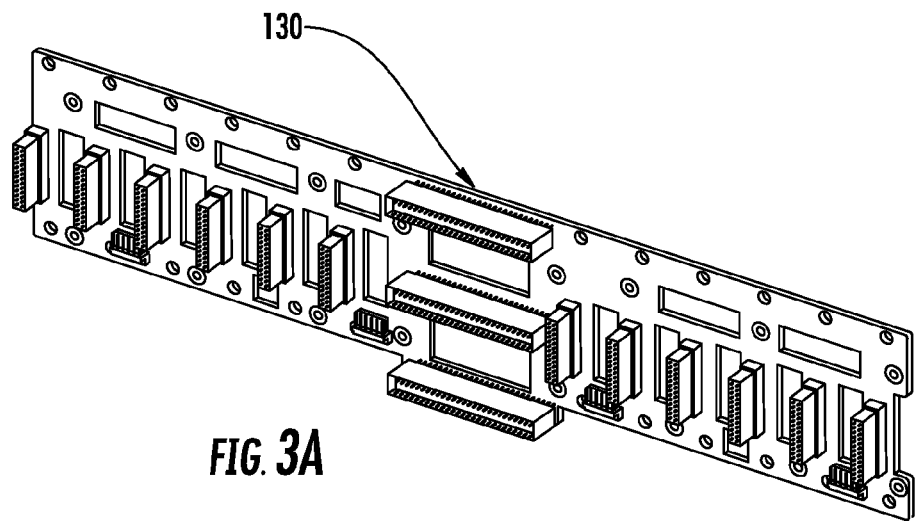
FIGS. 3A-3C are more detailed illustrations of the backplane of FIG. 1B, according to one embodiment of the present invention.
Figure 3B:
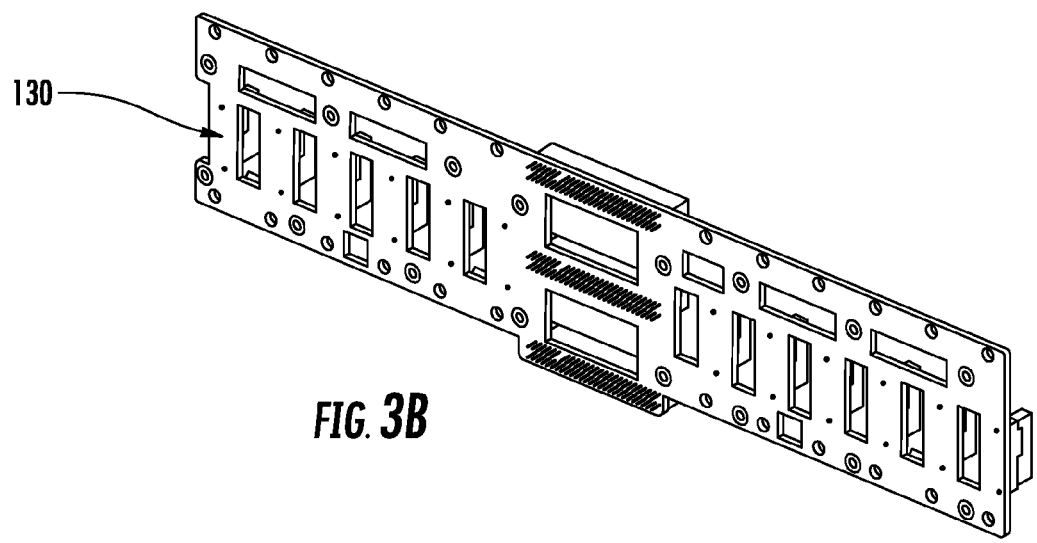
Figure 3C:
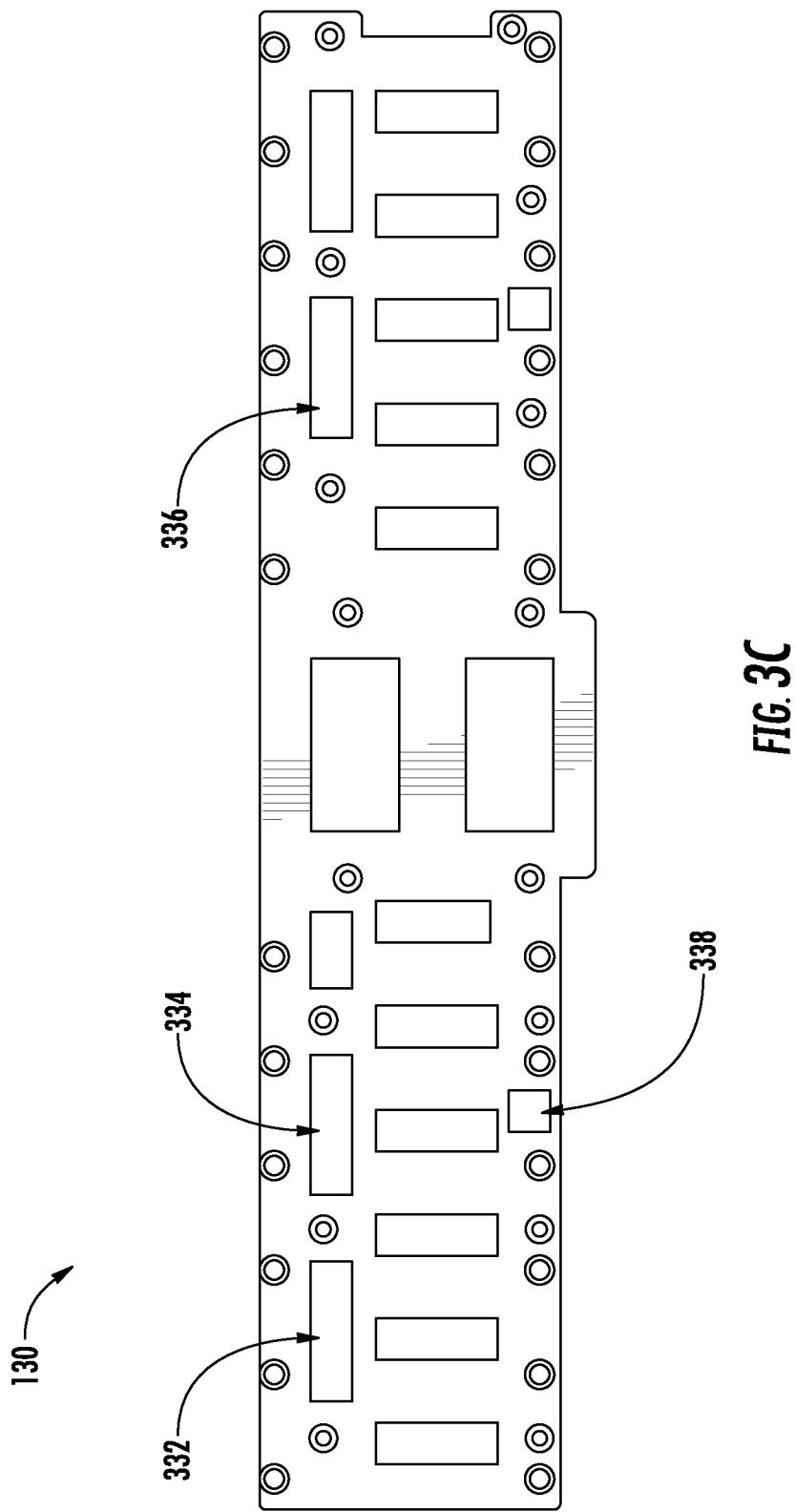

FIGS. 3A-3C are more detailed illustrations of the backplane of FIG. 1B, according to one embodiment of the present invention. FIG. 3A illustrates a primary side of backplane 130 to which multiple instances of circuit layout 110 may be coupled. In one embodiment, the primary side of backplane 130 provides each instance of circuit layout 110 coupled thereto with access to shared resources, including network access, power, and so forth. FIG. 3B illustrates a secondary side of backplane 130 to which multiple instances of fan assembly 140 may be coupled. In one embodiment, four instances of fan assembly 140 may be coupled to the secondary side of backplane 130, as also shown in FIG. 1B.

Referring generally to FIGS. 3A and 3B, backplane 130 includes large ventilation holes that permit a significantly higher level of airflow than possible with conventional backplanes, as also shown in FIG. 3C. In FIG. 3C, ventilation holes 332, 334, 336, and 338 are shown, among others, which permit airflow through backplane 130 and across circuit layout 110. Specifically, when circuit layout 110 is coupled to the primary side of backplane 130, and fan assembly 140 is coupled to the secondary side of backplane 130, fan assembly 140 induces airflow through backplane 130 and across circuit layout 110. Fan assembly 140 is described below in conjunction with FIGS. 4A-4B.

FIGS. 4A-4B are more detailed illustrations of the fan assembly of FIG. 1B, according to one embodiment of the present invention. As shown in FIG. 4A, fan assembly 140 includes fan cage 400 and fan 410. Fan cage 400 is a support structure configured stabilize fan 410 and to shield the blades of fan 410 from foreign objects. Fan cage 400 is mounted to fan 410 via specialized fasteners, shown in FIG. 4B.

As shown in FIG. 4B, fan cage 400 is mounted to fan 410 via damping rivet receptacles and damping rivets. For example, a damping rivet receptacle 420 may be inserted into fan 410, fan cage 400 may then be aligned with fan 410, and a damping rivet 430 may then be inserted through fan cage 400 and into damping rivet receptacle 420, thereby joining these different components together. Damping rivet receptacle 420 and damping rivet 430 are described below in conjunction with FIG. 6.

Referring generally to FIGS. 4A-4B, fan 410 has a specific geometry that takes advantage of the Venturi effect to increase airflow. In particular, fan 410 includes a convergent-divergent nozzle within which one or more sets of rotating fan blades are disposed. The convergent-divergent nozzle within fan 410 is configured to induce the Venturi effect to achieve the increase in airflow mentioned above. An exemplary cross-section of fan 410 is shown below in FIG. 5.

Figure 5:
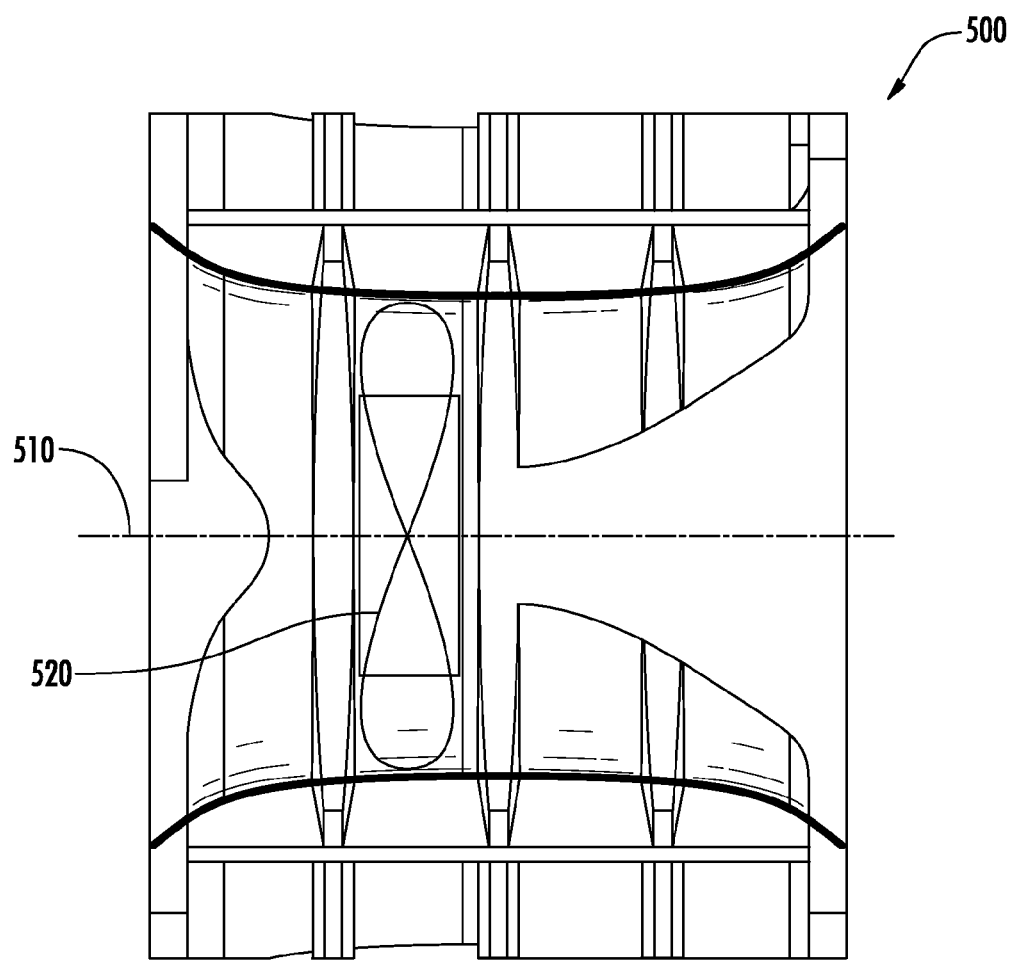
FIG. 5 illustrates a cross-section of the fan included within the fan assembly of FIGS. 4A-4B, according to one embodiment of the present invention.

FIG. 5 illustrates a cross-section of the fan included within the fan assembly of FIGS. 4A-4B, according to one embodiment of the present invention. As shown, cross section 500 reflects a longitudinal section of fan 410 taken along an axis 510 of rotation associated with a rotor 520. Cross section 500 of fan 410 is a convergent-divergent nozzle, meaning that midway along axis 510, the cross sectional area of fan 410 is less than the cross sectional area of fan 410 near either end of axis 510. Generally, cross section 500 has an hourglass profile.

This particular shape induces greater airflow than conventional cooling fan designs by leveraging the Venturi effect to increase the velocity of air midway through fan 410. Since rotor 520 is also disposed midway through fan 410, rotor 520 may operate with a higher rotational velocity that is concordant with the increased velocity of air. As such, fan assembly 140 may generate comparable airflow to conventional counter-rotating fan blade designs, without requiring counter-rotating fan blades.

In one embodiment, fan 410 may include a single rotor 520 as well as a single stator (not shown), or may include multiple rotors and stators (none shown). Fan 410 may also include an intake port located at one end of the convergent-divergent nozzle discussed above and an exhaust port located at the other end of that convergent-divergent nozzle. Each of the aforementioned intake and exhaust ports of the convergent-divergent nozzle may extend beyond the rotor(s) and/or stator(s) of fan 410, in like fashion as shown in FIG. 5. In certain embodiments, fan 410 operates as an exhaust fan configured to draw heated air away from circuit layout 110. In other embodiments, fan 410 operates as a ventilation fan configured to force cool air across circuit layout 110.

Conventional fans may be subject to vibrations that, in operation, diminish the efficiency of those fans for producing a cooling airflow. For example, a conventional fan could vibrate with sufficient force as to increase rotational friction associated with bearings that support the rotation of a rotor within that fan. In such a situation, the rotor within the conventional fan would rotate with a lower speed in response to the increase in friction, thereby decreasing the airflow provided by that fan. Fan assembly 140 shown in FIGS. 1B and 4A-4B is configured to reduce or avoid the aforementioned inefficiencies associated with conventional fans by implementing fasteners that dampen vibrations, as shown in FIGS. 6A-6B.

Figure 6A:
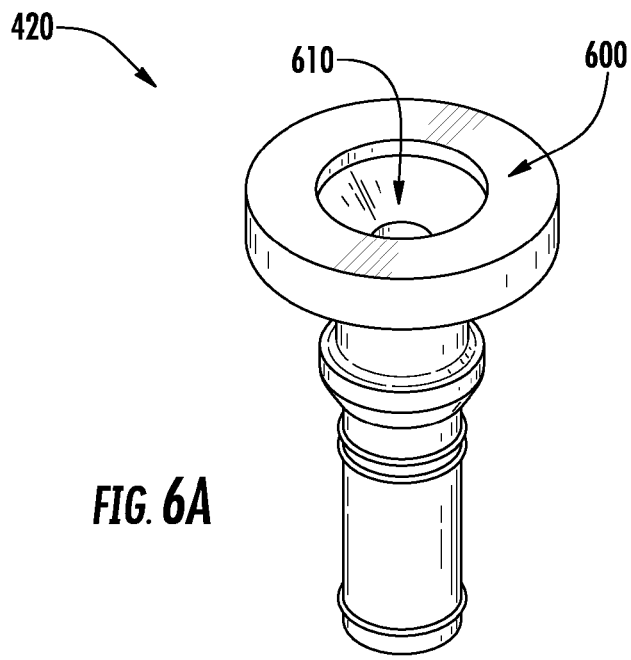
FIGS. 6A-6B are more detailed illustrations of the damping rivet receptacle of FIG. 4B, according to one embodiment of the present invention.
Figure 6B:
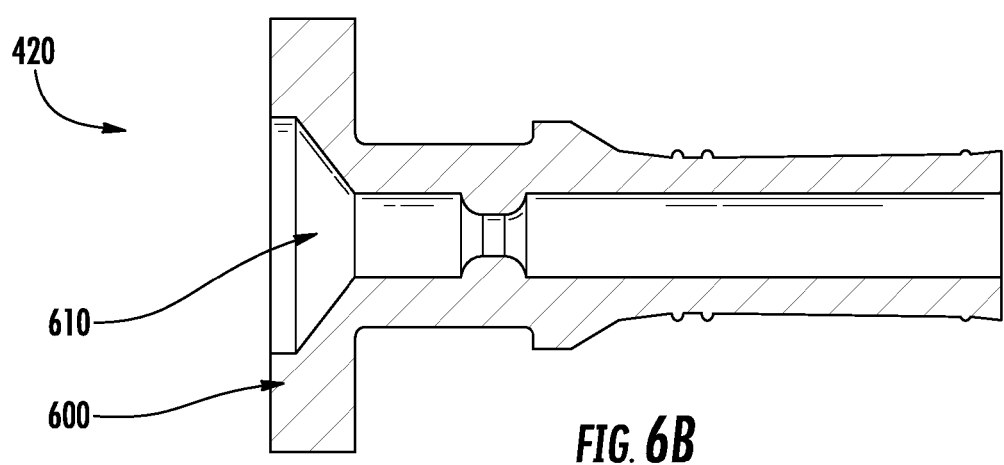

FIGS. 6A-6B are more detailed illustrations of the damping rivet receptacle of FIG. 4B, according to one embodiment of the present invention. FIG. 6A is a perspective view of damping rivet receptacle 420, while FIG. 6B is a cross sectional view of damping rivet receptacle 420.

Referring generally to FIGS. 6A-6B, as shown, damping rivet receptacle includes a damping portion 600 that substantially surrounds a receptacle portion 610. Receptacle portion 610 is a sink into which damping rivet 430 shown in FIG. 4B may be inserted when assembling fan assembly 140. Damping portion 600 is composed of a material that absorbs vibrations, such as, e.g., plastic, rubber, PORON®, etc. Damping rivet 430 may also be composed of such a material. Receptacle portion 610 is a generally cylindrical bore hole that may have a pinched portion for securing damping rivet 430, as specifically shown in FIG. 6B.

Referring back now to FIG. 4B, when fan cage 400 and fan 410 are assembled to form fan assembly 140, fan 410 is mounted to fan cage 400 via multiple instances of damping rivet receptacle 420 and corresponding instances of damping rivet 430. Each damping rivet receptacle 420 is inserted into a sink in fan 410. Fan cage 400 is positioned over each damping rivet receptacle, and multiple instances of damping rivet 430 may then be inserted through fan cage 400 and into a corresponding instance of damping rivet receptacle 420, thereby fastening fan cage 400 to fan 410. The assembly of these components is also described above.

Referring generally to FIGS. 1A-6B, fan assembly 140 may be mounted to backplane 130 of chassis 120 according to the configuration illustrated FIG. 1B. Since vibrations associated with fan assembly 140 may be minimized, chassis 120, and instances of circuit layout 110 included therein, may be isolated from those vibrations. Since backplane 130 includes larger ventilation holes than conventional designs, as mentioned, the effectiveness with which fan assembly 140 induces airflow is improved. As also mentioned, the specific geometry of fan 410 within fan assembly 140 also improves airflow. With the various techniques described herein, multiple high-performance processing nodes, such as processing nodes 112 and 114, may reside together on circuit layout 110 and operate simultaneously without increasing operating temperature beyond safe operating limits.

In practice, the techniques described above may be implemented to construct a server system that includes two or more times the number of processing nodes possible with conventional designs. Further, high performance processing nodes may be implemented in place of lower performance nodes. For example, a conventional server system typically would include just 12 processing nodes, where each of 12 conventional circuit layouts within the server would include only a single processing node. However, with the techniques described herein, a server system may be constructed that includes 24 high performance processing nodes, where each of the 12 circuit layouts includes two such high performance nodes. Further, the techniques described herein may extend to circuit layouts that include three or more processing nodes, allowing for server systems that include 36 or more processing nodes.

In one embodiment, circuit layout 110 is configured to implement a specific technique for cooling processing nodes 112 and 114. Generally, processing nodes 112 and 114 are cooled by the same instance of fan assembly 140, wherein that fan assembly 140 is also shared with other instances of circuit layout 110. However, each of processing nodes 112 and 114 may also be cooled with a single dedicated fan assembly 140. The technique described below is generally applicable to cooling circuit layout 110 and any numbering processing nodes included therein.

Figure 7:
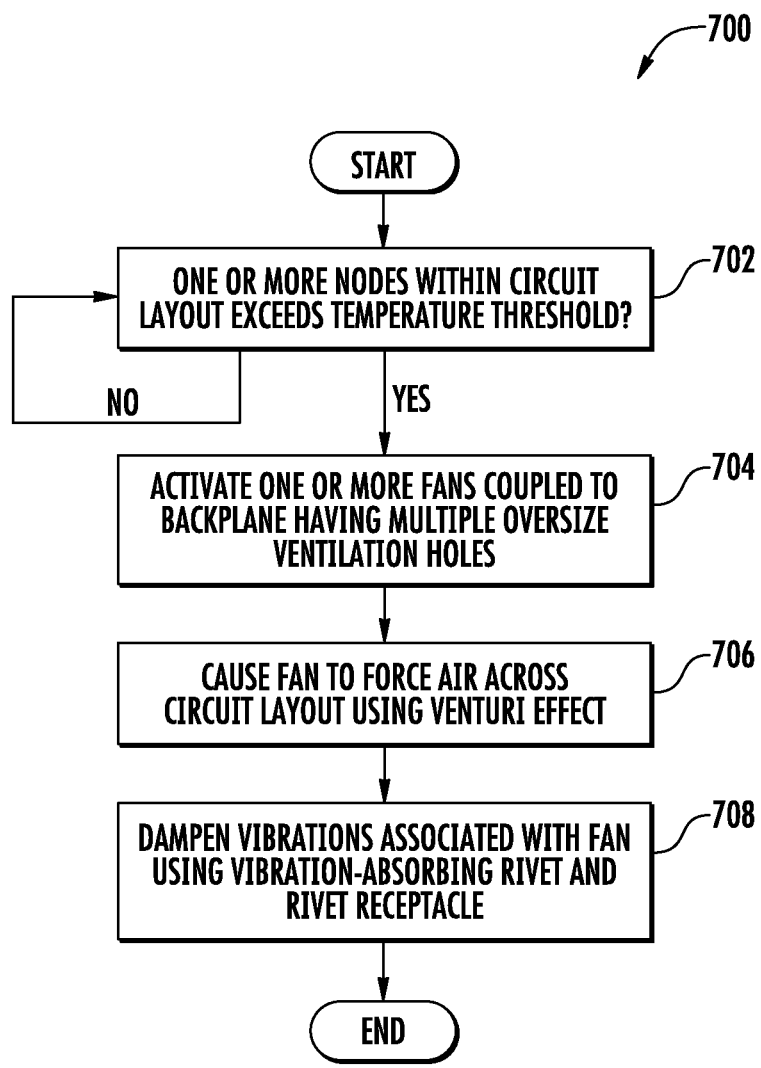
FIG. 7 is a flow diagram of method steps for cooling a circuit layout that includes multiple processing nodes, according to one embodiment of the present invention.

FIG. 7 is a flow diagram of method steps for cooling a circuit layout that includes multiple processing nodes, according to one embodiment of the present invention. Although the method steps are described in conjunction with the system of FIGS. 1-6, persons skilled in the art will understand that any system configured to perform the method steps, in any order, is within the scope of the present invention.

As shown, a method 700 begins at step 702, where circuit layout 110 determines whether the temperature of either of nodes 112 and 114 exceeds a temperature threshold. The temperature threshold is associated with a design specification corresponding to those nodes. Circuit layout 110 generally includes temperature sensors configured to determine whether processing nodes 112 and 114 operate within design specifications. In one embodiment, circuit layout 110 includes different types of processing nodes, such as a high performance node and a low performance node, that have different temperature thresholds. In such embodiments, circuit layout 110 may rely on either of the two thresholds, although generally reliance on the lower of the two thresholds is preferable. Circuit layout 110 repeats step 702 until the temperature associated with either of nodes 112 and 114 exceeds the temperature threshold, then proceeds to step 704.

At step 704, circuit layout 110 activates fan 410 within fan assembly 140 in order to provide cooling airflow to circuit layout 110. Fan assembly is coupled to backplane 130 that, in turn, is coupled to circuit layout 110. As discussed above, fan assembly 140 has a specific geometry that increases airflow, while backplane 130 also has a specific geometry that permits that increase in airflow.

At step 706, circuit layout 110 causes fan 410 to force air across circuit layout 110 leveraging the Venturi effect. Fan 410 induces the Venturi effect with a convergent-divergent cross section, as discussed above in conjunction with FIG. 5. Fan 410 may operate with a higher rotational speed given that the Venturi effect increases airflow velocity proximate to rotor 520 within that fan.

At step 708, instances of damping rivet receptacles 420 and corresponding instances of damping rivets 430 dampen vibrations associated with fan assembly 140. Such vibrations typically limit the efficiency of conventional fans. However, the damping rivets and receptacle described herein absorb these vibrations, allowing fan 410 to achieve a higher efficiency and corresponding airflow compared to such conventional fans.

Persons skilled in the art will understand that circuit layout 110 may repeat the method 700 on an as needed basis to cycle fan 410 on and off. Specifically, when the temperature of processing odes 112 and 114 fall beneath the temperature threshold, circuit layout 110 may slow or stop fan 410, and then repeat the method 700. The various techniques described herein, in combination with one another, increase the degree to which circuit layout 110 can be cooled. With this increased cooling, circuit layout may include multiple high performance nodes without suffering from adverse thermal effects.

In sum, an circuit layout includes two or more high performance processing nodes that are cooled by a cooling fan. The cooling fan resides in a cooling fan assembly that relies on principles of aerodynamics to maximize airflow. The cooling fan assembly is coupled to the opposite side of a backplane to which the circuit layout is mounted. The backplane includes large ventilation holes to permit the cooling fan to induce significantly more airflow across the circuit layout than possible with conventional designs.

At least one advantage of the approaches discussed herein is circuit layouts can be constructed to meet the competing objectives of high node performance and high node density. Accordingly, data centers can be built that offer high performance computing without requiring a significant increase in physical real estate.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A system, comprising:
 a circuit layout that includes at least a first processing node and a second processing node, wherein the circuit layout includes thermal sensors configured to monitor one or more temperatures, wherein the one or more temperatures includes a first temperature associated with the first processing node and a second temperature associated with the second processing node;
 a backplane coupled to the circuit layout and including a plurality of ventilation holes; and
 a fan assembly coupled to the backplane and configured to deliver an airflow across the circuit layout including:
  a fan having a symmetrical convergent-divergent cross sectional area and including a first rotor disposed along an axis of the fan, wherein the profile of the convergent side of the cross sectional area is substantially the same as the profile of the divergent side of the cross sectional area, and
  a fan cage coupled to the fan via a damping rivet and a damping rivet receptacle, wherein the damping rivet receptacle includes a pinched region configured to secure a portion of the damping rivet within the damping rivet receptacle and a damping region that surrounds the pinched region and comprises a material that absorbs vibrations.

2. The system of claim 1, wherein the convergent-divergent cross sectional area of the fan is configured to induce the Venturi effect in order to increase the velocity of air traveling through the fan at a position substantially midway along the axis of the fan.

3. The system of claim 2, wherein the cross sectional area of the fan midway along the axis of the fan is smaller than the cross sectional area of the fan at an endpoint of the axis of the fan.

4. The system of claim 1, wherein the fan includes a first port that extends beyond the first rotor in a first direction along the axis of the fan.

5. The system of claim 4, wherein the fan further includes a second port that extends beyond the first rotor in a second direction along the axis of the fan.

6. The system of claim 1, wherein the damping rivet and the damping rivet receptacle are configured to dampen vibrations associated with the fan.

7. The system of claim 1, wherein the first processing node and the second processing node share at least one resource provided by the circuit layout.

8. The system of claim 7, wherein the first resource comprises a power supply configured to power the first processing node and the second processing node.

9. The system of claim 1, wherein the circuit layout is configured to activate the fan in response to detecting that the first temperature exceeds the first temperature threshold or the second temperature exceeds the second temperature threshold, wherein the first temperature threshold is associated with the first processing node and the second temperature threshold is associated with the second processing node.

10. The system of claim 1, wherein the cross sectional area of the fan has an hourglass profile.

11. The system of claim 10, wherein the cross sectional area has a rounded interior contour.

12. The system of claim 1, wherein the fan further includes a first rotor disposed substantially midway along an axis of the fan.

13. The system of claim 1, wherein the circuit layout is configured to control the fan based on whether one or more temperatures measured from the circuit layout exceeds one of a first temperature threshold and a second temperature threshold, wherein the second temperature threshold is different from the first temperature threshold.

14. A computer system, comprising:
a subsystem, including:
a circuit layout that includes at least a first processing node and a second processing node, wherein the circuit layout includes thermal sensors configured to monitor one or more temperatures, wherein the one or more temperatures includes a first temperature associated with the first processing node and a second temperature associated with the second processing node,
a backplane coupled to the circuit layout and including a plurality of ventilation holes, and
a fan assembly coupled to the backplane and configured to deliver an airflow across the circuit layout including:
a fan having a symmetrical convergent-divergent cross sectional area and including a first rotor disposed along an axis of the fan, wherein the profile of the convergent side of the cross sectional area is substantially the same as the profile of the divergent side of the cross sectional area, and
a fan cage coupled to the fan via a damping rivet and a damping rivet receptacle, wherein the damping rivet receptacle includes a pinched region configured to secure a portion of the damping rivet within the damping rivet receptacle and a damping region that surrounds the pinched region and comprises a material that absorbs vibrations.

15. The computer system of claim 14, wherein the convergent-divergent cross sectional area of the fan is configured to induce the Venturi effect in order to increase the velocity of air traveling through the fan at a position substantially midway along the axis of the fan.

16. The computer system of claim 15, wherein the cross sectional area of the fan midway along the axis of the fan is smaller than the cross sectional area of the fan at an endpoint of the axis of the fan.

17. The computer system of claim 14, wherein the damping rivet and the damping rivet receptacle are configured to dampen vibrations associated with the fan.

18. The computer system of claim 14, wherein the first processing node and the second processing node share at least one resource provided by the circuit layout.

19. A computer-implemented method for cooling a circuit layout, the method comprising:
monitoring via one or more thermal sensors a first temperature associated with a first processing node included within the circuit layout;
monitoring via one or more thermal sensors a second temperature associated with a second processing node included within the circuit layout;
determining that the first temperature exceeds a first threshold value or the second temperature exceeds a second threshold value, wherein the second temperature threshold is different from the first temperature threshold;
causing a fan to deliver airflow to the circuit layout,
wherein the fan has a symmetrical convergent-divergent cross sectional area and includes a first rotor disposed along an axis of the fan, wherein a profile of the convergent side of the cross sectional area is substantially the same as the profile of the divergent side of the cross sectional area, and
wherein a fan cage is coupled to the fan via a damping rivet and a damping rivet receptacle, wherein the damping rivet receptacle includes a pinched region configured to secure a portion of the damping rivet within the damping rivet receptacle and a damping region that surrounds the pinched region and comprises a material that absorbs vibrations.

* * * * *